United States Patent
Chiu et al.

(10) Patent No.: US 7,933,118 B2
(45) Date of Patent: Apr. 26, 2011

(54) EXPANSION UNIT FOR AN ELECTRONIC DEVICE

(75) Inventors: Chih-Chung Chiu, Taipei (TW); Huang-Lin Lee, Taipei (TW)

(73) Assignee: Compal Electronics Inc., Taipei (TW)

( * ) Notice: Subject to any disclaimer, the term of this patent is extended or adjusted under 35 U.S.C. 154(b) by 305 days.

(21) Appl. No.: 12/191,308

(22) Filed: Aug. 14, 2008

(65) Prior Publication Data
US 2009/0231793 A1 Sep. 17, 2009

(30) Foreign Application Priority Data
Mar. 13, 2008 (TW) ............................... 97108880 A

(51) Int. Cl.
*G06F 1/16* (2006.01)
(52) U.S. Cl. ............... 361/679.44; 361/679.4; 710/303; 710/304
(58) Field of Classification Search ............. 361/679.43, 361/679.44, 679.05
See application file for complete search history.

(56) References Cited

U.S. PATENT DOCUMENTS

| | | | | |
|---|---|---|---|---|
| 4,996,628 A * | 2/1991 | Harvey et al. | ................. | 361/735 |
| 5,109,572 A * | 5/1992 | Park | ................. | 16/334 |
| 5,173,837 A * | 12/1992 | Blackwell et al. | ....... | 361/679.28 |
| 5,262,759 A * | 11/1993 | Moriconi et al. | ........ | 361/679.29 |
| 5,355,279 A * | 10/1994 | Lee et al. | ................. | 361/679.09 |
| 5,379,183 A * | 1/1995 | Okonsky et al. | ......... | 361/679.09 |
| 5,452,180 A * | 9/1995 | Register et al. | .......... | 361/679.44 |
| 5,494,447 A * | 2/1996 | Zaidan | ............................ | 439/31 |
| 5,535,093 A * | 7/1996 | Noguchi et al. | ......... | 361/679.43 |
| 5,619,397 A * | 4/1997 | Honda et al. | ............ | 361/679.43 |
| 5,745,340 A * | 4/1998 | Landau | ......................... | 345/2.1 |
| 6,016,171 A * | 1/2000 | Tsao | ............................ | 348/836 |
| 6,142,796 A * | 11/2000 | Behl et al. | ..................... | 439/131 |
| 6,359,776 B2 * | 3/2002 | Carlson | .................... | 361/679.28 |
| 6,396,687 B1 * | 5/2002 | Sun et al. | ................. | 361/679.43 |
| 6,813,145 B2 * | 11/2004 | DeLuga | ................ | 361/679.41 |
| 6,898,080 B2 * | 5/2005 | Yin et al. | ................. | 361/679.41 |
| 6,914,197 B2 * | 7/2005 | Doherty et al. | ............... | 174/254 |
| 6,918,562 B2 * | 7/2005 | Lee et al. | ....................... | 248/130 |
| 6,952,343 B2 * | 10/2005 | Sato | ........................ | 361/679.57 |
| 6,976,799 B2 * | 12/2005 | Kim et al. | ..................... | 400/472 |
| D520,013 S * | 5/2006 | Yang | ........................... | D14/434 |
| 7,068,496 B2 * | 6/2006 | Wong et al. | ............. | 361/679.28 |
| 7,200,702 B2 * | 4/2007 | Keely et al. | .................. | 710/303 |
| 7,298,611 B1 * | 11/2007 | Carnevali | ................ | 361/679.55 |
| 7,567,433 B2 * | 7/2009 | Chen | ........................ | 361/679.26 |
| 7,599,178 B2 * | 10/2009 | Huang et al. | ............. | 361/679.43 |
| 7,699,377 B2 * | 4/2010 | Vitito | ............................ | 296/37.8 |
| 2005/0057896 A1* | 3/2005 | Homer | ........................ | 361/686 |
| 2005/0105260 A1* | 5/2005 | Lee | ................................ | 361/683 |
| 2005/0111182 A1* | 5/2005 | Lin et al. | ....................... | 361/686 |
| 2006/0061958 A1* | 3/2006 | Solomon et al. | ............. | 361/686 |

(Continued)

FOREIGN PATENT DOCUMENTS

CN 1821934 8/2006

(Continued)

*Primary Examiner* — Jayprakash N Gandhi
*Assistant Examiner* — Anthony Q Edwards
(74) *Attorney, Agent, or Firm* — Jianq Chyun IP Office

(57) ABSTRACT

An expansion unit detachably assembled to an electronic device is provided. The electronic device has a device connector on one side thereof. The expansion unit for the electronic device includes a base, a pivoting mechanism, and an expansion unit connector. The pivoting mechanism is located on one side of the base, and includes a shaft and a bearing fitting therewith. The expansion unit connector is disposed in the shaft and rotated along with the shaft in the bearing, and is detachably and electrically connected to the device connector. When the expansion unit connector is connected to the device connector, the position of the electronic device relative to the base may be adjusted by the pivoting mechanism.

12 Claims, 8 Drawing Sheets

U.S. PATENT DOCUMENTS

| | | | |
|---|---|---|---|
| 2006/0221565 A1* | 10/2006 | Doherty et al. | 361/683 |
| 2008/0002355 A1* | 1/2008 | Carnevali | 361/686 |
| 2008/0165492 A1* | 7/2008 | Ward et al. | 361/686 |
| 2008/0273297 A1* | 11/2008 | Kumar | 361/680 |

FOREIGN PATENT DOCUMENTS

| | | |
|---|---|---|
| TW | 525125 | 3/2003 |
| TW | 578973 | 3/2004 |
| TW | M280496 | 11/2005 |

* cited by examiner

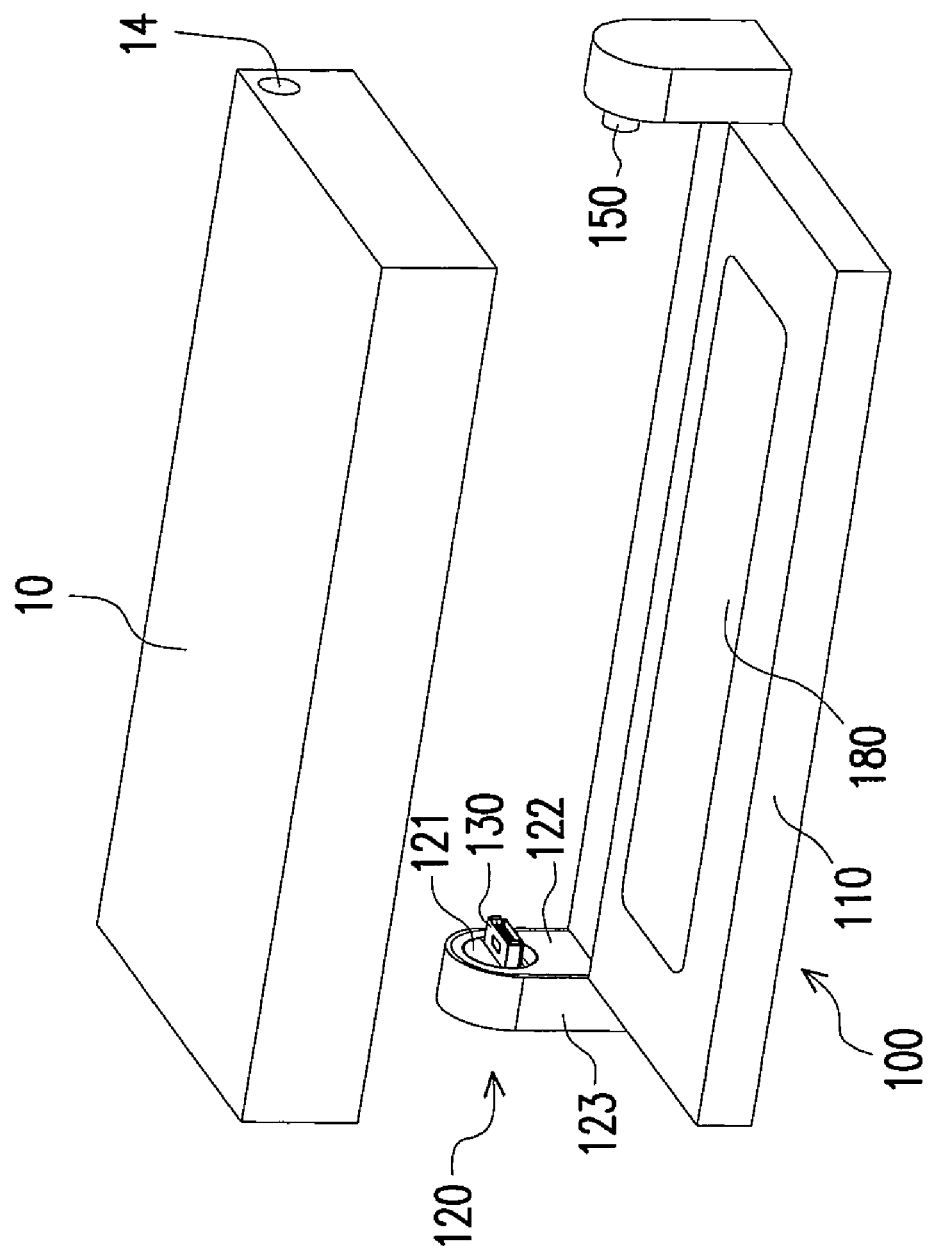

EXPANSION UNIT FOR AN ELECTRONIC DEVICE

CROSS-REFERENCE TO RELATED APPLICATION

This application claims the priority benefit of Taiwan application serial no. 97108880, filed on Mar. 13, 2008. The entirety of the above-mentioned patent application is hereby incorporated by reference herein and made a part of this specification.

BACKGROUND OF THE INVENTION

1. Field of the Invention

The present invention relates to an expansion unit for an electronic device, in particular, to an expansion unit rotatably connected to the electronic device.

2. Description of Related Art

For the convenience of carrying, the volumes of the electronic products are continuously reduced, and consequently some functions are removed. In order to restore or expand the functions of the electronic products, expansion accessories are commonly selected. When the expansion accessories are used, the expansion accessories are connected to the electronic products, and when not, the expansion accessories are detached therefrom. Therefore, the expansion accessories may achieve a higher flexibility of the electronic products in use.

Currently, a mobile internet device (MID) emphasizing the capability of accessing the internet anywhere has been put forward in the market. Since the MID stresses on the function of wirelessly accessing the internet anywhere, under the requirements for limited volume and size of the image display, the press button keyboard, commonly seen on a notebook computer, is not employed in the MID, and the display occupies a main operation surface of the MID instead.

SUMMARY OF THE INVENTION

Accordingly, the present invention is directed to an expansion unit rotatably connected to the electronic device, which is adapted to be detachably assembled to an electronic device for providing additional functions.

The present invention provides an expansion unit for an electronic device, which is adapted to be detachably assembled to an electronic device. The electronic device has a device connector on one side thereof. The expansion unit for an electronic device includes a base, a pivoting mechanism, and an expansion unit connector. The pivoting mechanism is located on one side of the base, and includes a shaft and a bearing fitting therewith. The expansion unit connector is disposed in the shaft and rotated along with the shaft relative to the bearing, and is detachably and electrically connected to the device connector. When the expansion unit connector is connected to the device connector, the position of the electronic device relative to the base is adjusted by the pivoting mechanism.

In an embodiment of the present invention, the expansion unit for an electronic device further includes a transmission line connected to the expansion unit connector, extending into the base. A section of the transmission line winds around the shaft.

In an embodiment of the present invention, the pivoting mechanism further includes a housing for accommodating the shaft and the transmission line.

In an embodiment of the present invention, the expansion unit for an electronic device further includes a keyboard module disposed on the base and electrically connected to the device connector of the electronic device through the transmission line and the expansion unit connector.

In an embodiment of the present invention, the expansion unit for an electronic device further includes a battery module disposed in the base and electrically connected to the device connector of the electronic device through the transmission line and the expansion unit connector.

In an embodiment of the present invention, the shaft between the electronic device and the expansion unit provides a torsion relative to the electronic device and the expansion unit.

In an embodiment of the present invention, the expansion unit for an electronic device further includes another shaft disposed on an other side of the base, for fitting with another bearing disposed on an other side of the electronic device.

In an embodiment of the present invention, the other shaft of the base provides a torsion relative to the electronic device and the expansion unit.

In an embodiment of the present invention, the expansion unit for an electronic device further includes an adjusting mechanism disposed between the pivoting mechanism and the base, for adjusting a distance between the pivoting mechanism and the base.

In an embodiment of the present invention, the adjusting mechanism includes a slide rail, a slide member, and a reset member. The slide rail is disposed on the base. The slide member is slid along the slide rail between an extended position and a retracted position. The reset member is disposed between the slide rail and the slide member, for forcing the slide member to slide towards the extended position.

In an embodiment of the present invention, the adjusting mechanism further includes a stop member disposed on the slide rail, for defining a sliding range of the slide member relative to the slide rail.

In an embodiment of the present invention, the adjusting mechanism further includes a trigger and another reset member. The trigger is pivotally connected to the slide rail, for buckling the slide member at the retracted position. The other reset member is disposed between the trigger and the slide rail.

Based on the above, the position of the electronic device relative to the base of the expansion unit for an electronic device is adjusted by the pivotal mechanism of the expansion unit for an electronic device. Moreover, the expansion unit connector and the transmission line of the expansion unit for an electronic device are hidden in the pivoting mechanism. Therefore, when the expansion unit for an electronic device and the electronic device are assembled, the expansion unit connector and the transmission line are not exposed, thus maintaining a fine appearance.

In order to make the aforementioned and other objectives, features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A and 1B are schematic views respectively taken from two different angles of view showing an expansion unit for an electronic device according to an embodiment of the present invention.

DESCRIPTION OF THE EMBODIMENTS

Figure 1A:
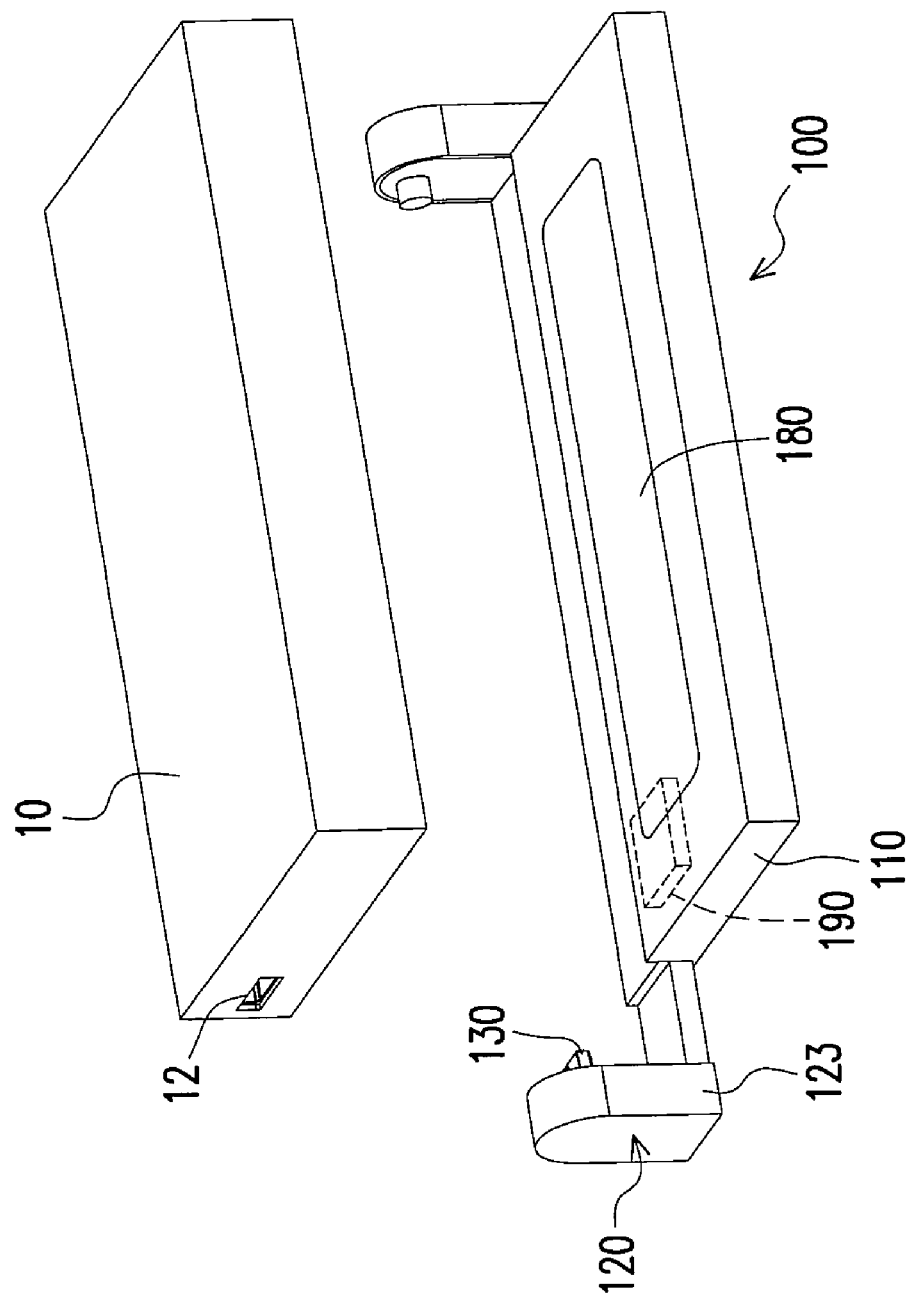

Reference will now be made in detail to the present embodiments of the invention, examples of which are illustrated in the accompanying drawings. Wherever possible, the same reference numbers are used in the drawings and the description to refer to the same or like parts.

FIGS. 1A and 1B are schematic views respectively taken from two different angles of view showing an expansion unit for an electronic device according to an embodiment of the present invention. Referring to FIGS. 1A and 1B, the expansion unit 100 for an electronic device in this embodiment is adapted to be detachably assembled to an electronic device 10. The electronic device 10 includes a device connector 12 on one side thereof. In this embodiment, the electronic device 10 may be a mobile internet device (MID) or any other similar electronic devices having an image display function.

The expansion unit 100 for an electronic device includes a base 110, a pivoting mechanism 120, and an expansion unit connector 130. The pivoting mechanism 120 is disposed on one side of the base 110. The expansion unit connector 130 is disposed in the pivoting mechanism 120, and is detachably and electrically connected to the device connector 12. Therefore, when the expansion unit connector 130 is connected to the device connector 12, the electronic device 10 may expand electrical functions by using the expansion unit 100 for an electronic device, and the position of the electronic device 10 relative to the base 110 is further adjusted by the pivoting mechanism 120.

In order to expand the electrical functions of the electronic device 10, in this embodiment, the expansion unit 100 for an electronic device further includes a keyboard module 180 disposed on the base 110, so as to provide a manual input function for the user. Moreover, the expansion unit 100 for an electronic device also includes a battery module 190 disposed on the base 110, for providing electricity to the electronic device 10. In other embodiments (not shown), the expansion unit 100 for an electronic device further includes other modules for expanding other functions.

Figure 2:
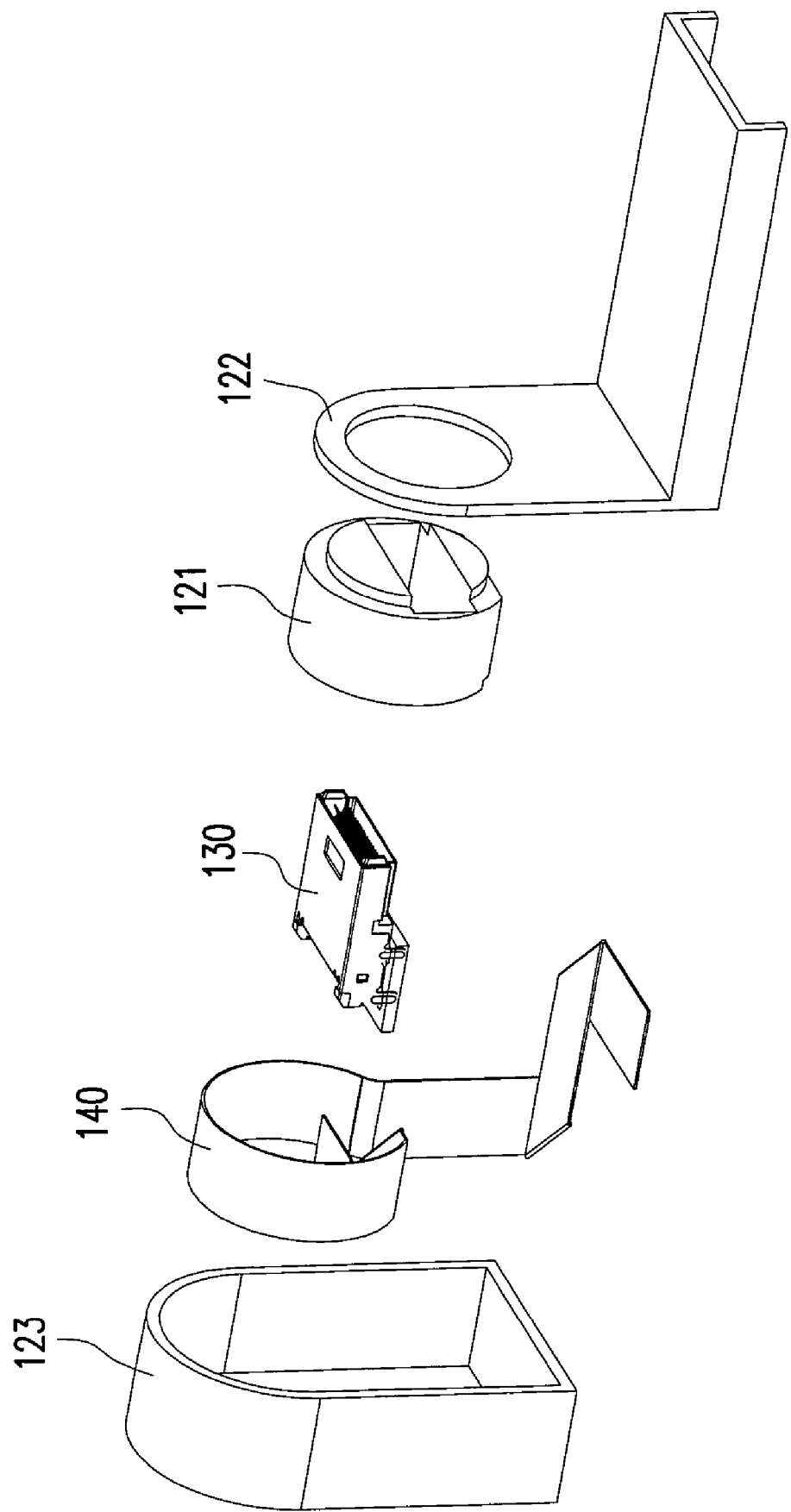
FIG. 2 is an exploded view of a pivoting mechanism, an expansion unit connector, and a transmission line in FIG. 1B.

Referring to FIGS. 1B and 2, the pivoting mechanism 120 includes a shaft 121 and a bearing 122 fitting therewith. The expansion unit connector 130 is disposed in the shaft 121 and rotated along with the shaft 121 relative to the bearing 122, and is detachably and electrically connected to the device connector 12. The shaft 121 may provide a torsion relative to the electronic device 10 and the expansion unit 100, so as to force the electronic device 10 to rotate relative to the expansion unit 100 in a stepped or non-stepped manner.

The expansion unit 100 for an electronic device further includes a transmission line 140 connected to the expansion unit connector 130 and extending into the base 110. In this embodiment, a section of the transmission line 140 winds around the shaft 121, and also is rotated with the shaft 121 relative to the bearing 122. Therefore, the keyboard module 180 and the battery module 190 are both electrically connected to the device connector 12 of the electronic device 10 through the transmission line 140 and the expansion unit connector 130. Moreover, the pivoting mechanism 120 further includes a housing 123, for accommodating and hiding the shaft 121, a part of the expansion unit connector 130, and the transmission line 140.

Referring to FIG. 1B, in this embodiment, the expansion unit 100 for an electronic device further includes another shaft 150 disposed on the other side of the base 110, for fitting with another bearing 14 of the electronic device 10 disposed on the other side of the electronic device 10. The shaft 150 is set to enhance the stability of the electronic device 10 rotated relative to the base 110 through the pivoting mechanism 120. According to the different designs of the product, the other shaft 150 on the base 110 may provide a torsion relative to the electronic device 10 and the expansion unit 100, so as to force the electronic device 10 to rotate relative to the expansion unit 100 in a stepped or non-stepped manner. The other shaft 150 on the base 110 and the shaft 121 may provide torsions at the same time according to requirements of the product, or one of them provides the torsion, which is not intended to limit the scope of the present invention.

Figure 3:
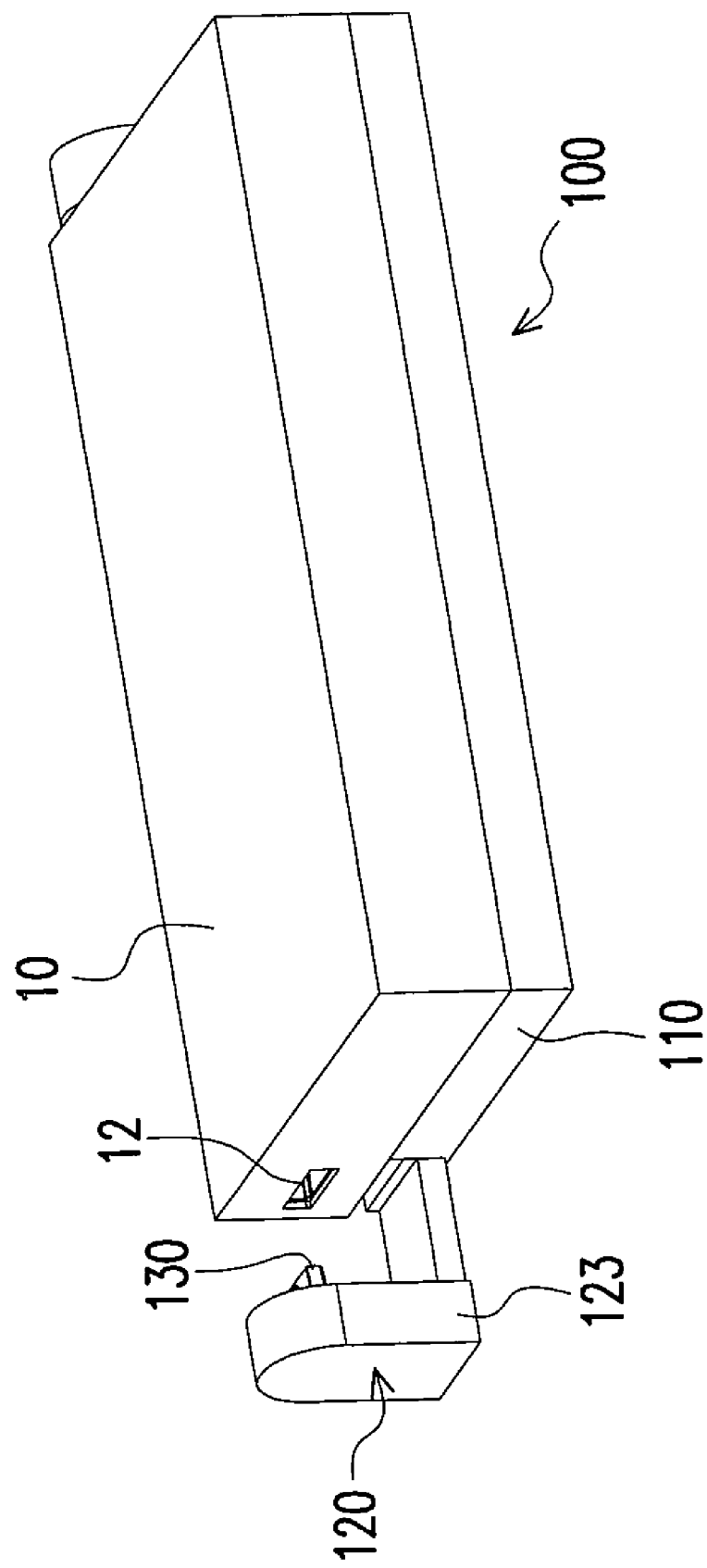
FIGS. 3 and 4 show assembly processes of the electronic device and the expansion unit for an electronic device.
Figure 4:
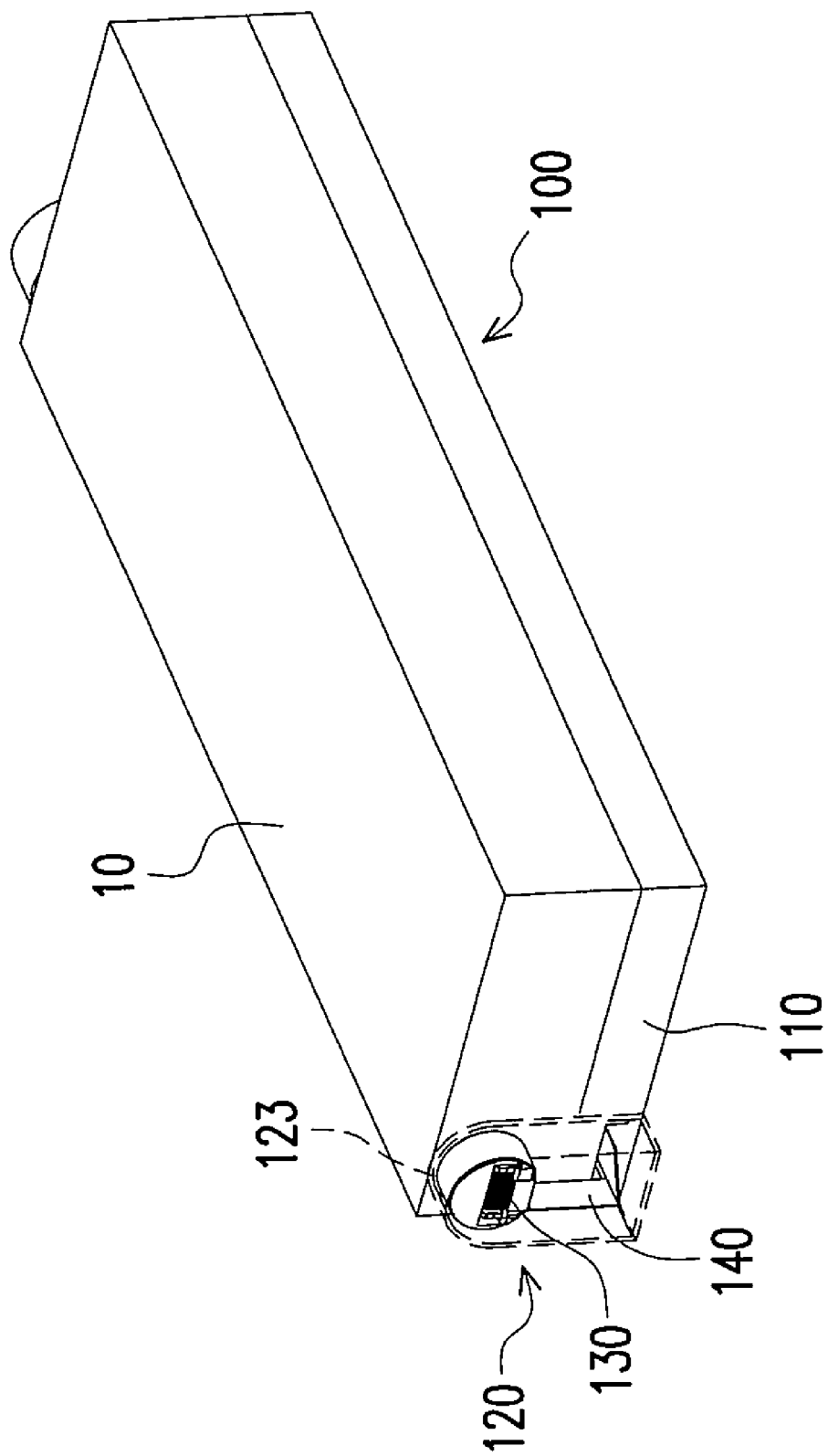

FIGS. 3 and 4 show assembly processes of the electronic device and the expansion unit for an electronic device. Referring to FIGS. 1B and 3, the bearing 14 of electronic device 10 is made to fit with the shaft 150, and the device connector 12 is aligned with the expansion unit connector 130. Then, the pivoting mechanism 120 is moved towards the electronic device 10, so as to connect the expansion unit connector 130 to the device connector 12, as shown in FIG. 4.

Figure 5:
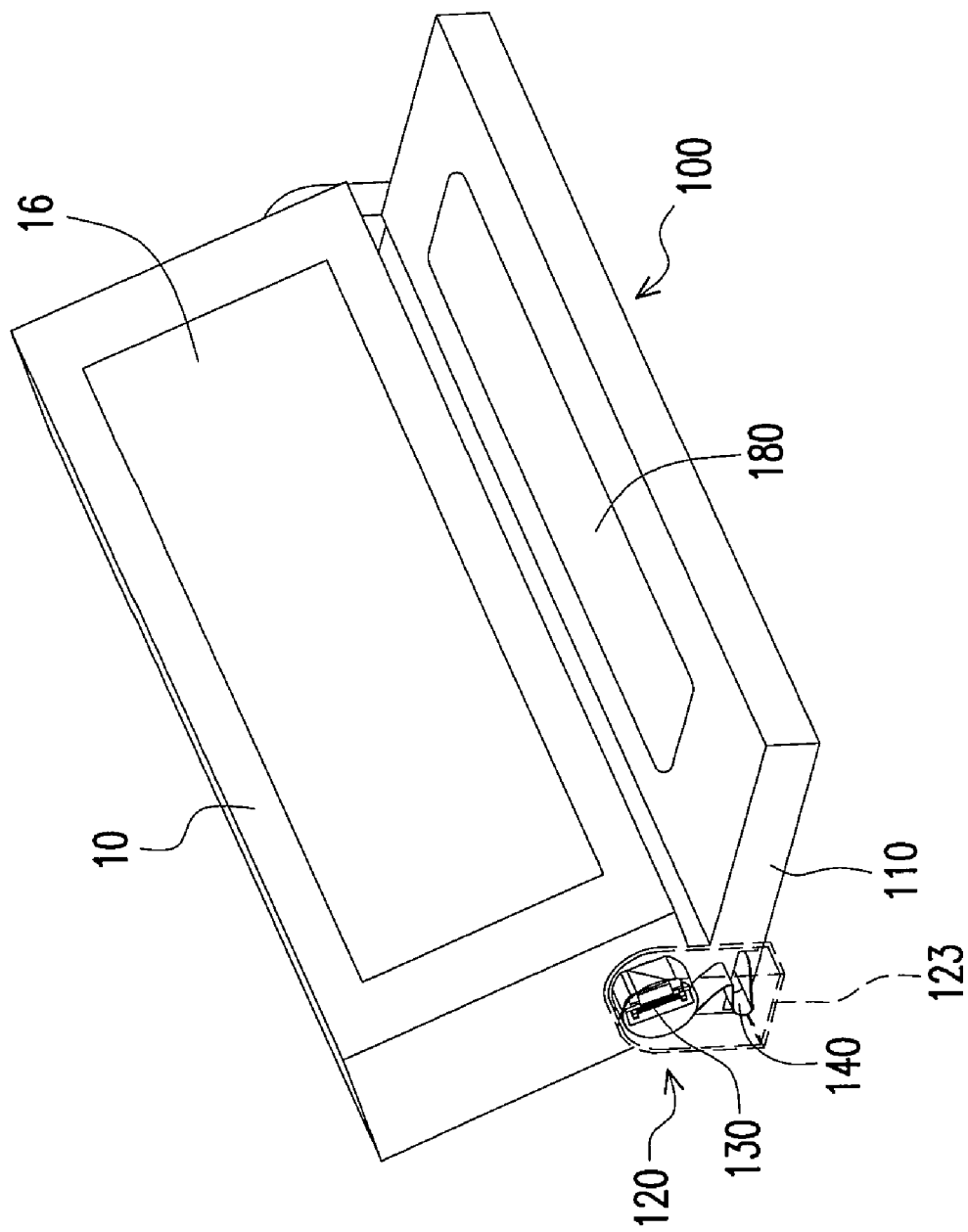
FIG. 5 shows a state of the electronic device in FIG. 4 after being rotated relative to the base of the expansion unit for an electronic device.

FIG. 5 shows a state of the electronic device in FIG. 4 after being rotated relative to the base of the expansion unit for an electronic device. For the convenience of illustrating, the housing 123 of the pivoting mechanism 120 in FIGS. 4 and 5 is indicated by dashed lines. Referring to FIGS. 4 and 5, after the electronic device 10 is assembled to the expansion unit 100 for an electronic device, the position of the electronic device 10 relative to the base 110 may be adjusted by using the shaft 121 and the bearing 122 on one side of the base 110 and the shaft 150 and the bearing 14 on the other side of the base 110 (see FIG. 1B). Therefore, an elevation of an image display 16 of the electronic device 10 relative to the base 110 may also be adjusted.

Figure 6A:
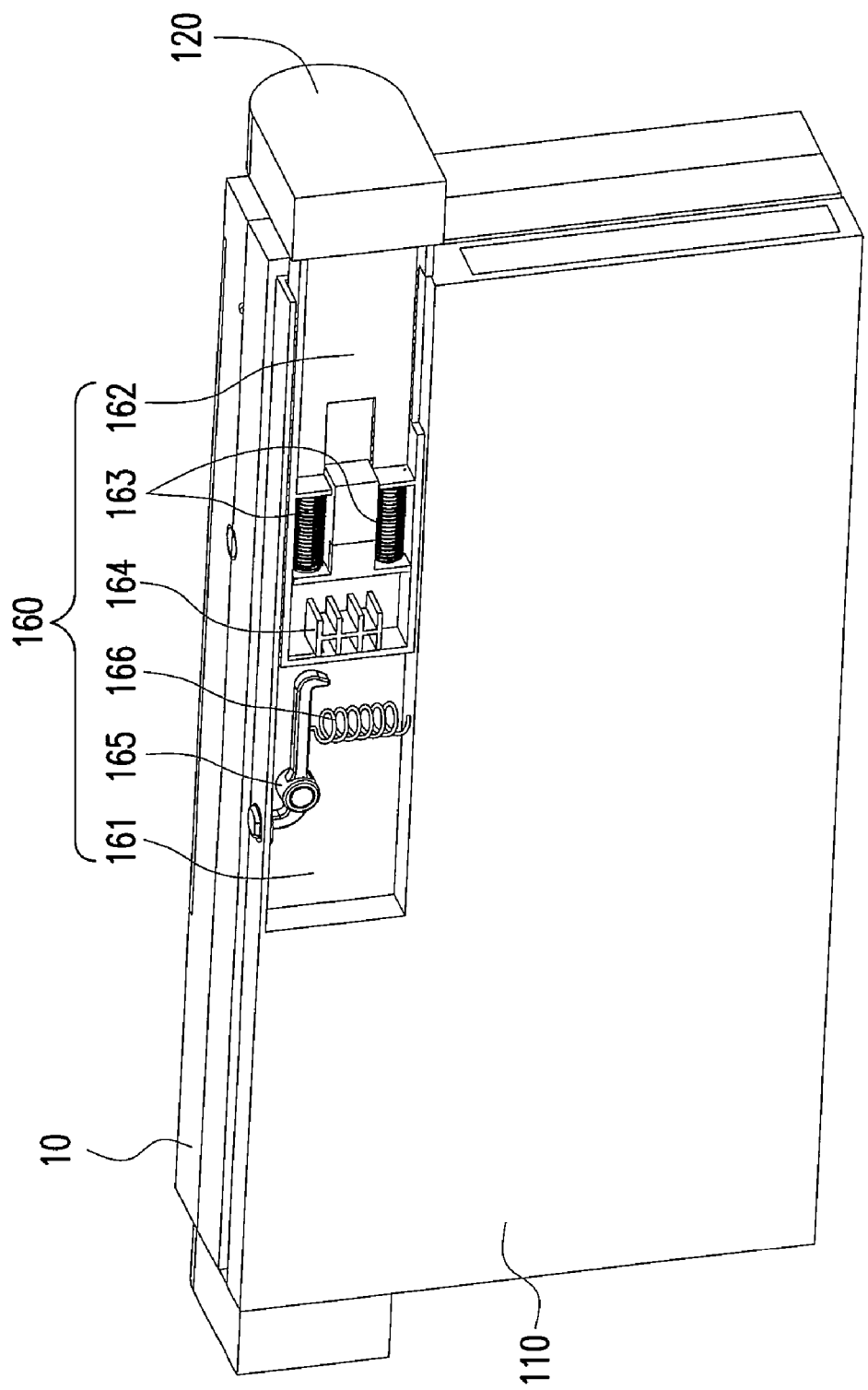
FIGS. 6A and 6B are partial perspective views respectively illustrating an adjusting mechanism when at an extended position and at a retracted position after the expansion unit for an electronic device and the electronic device in FIG. 3 are assembled.
Figure 6B:
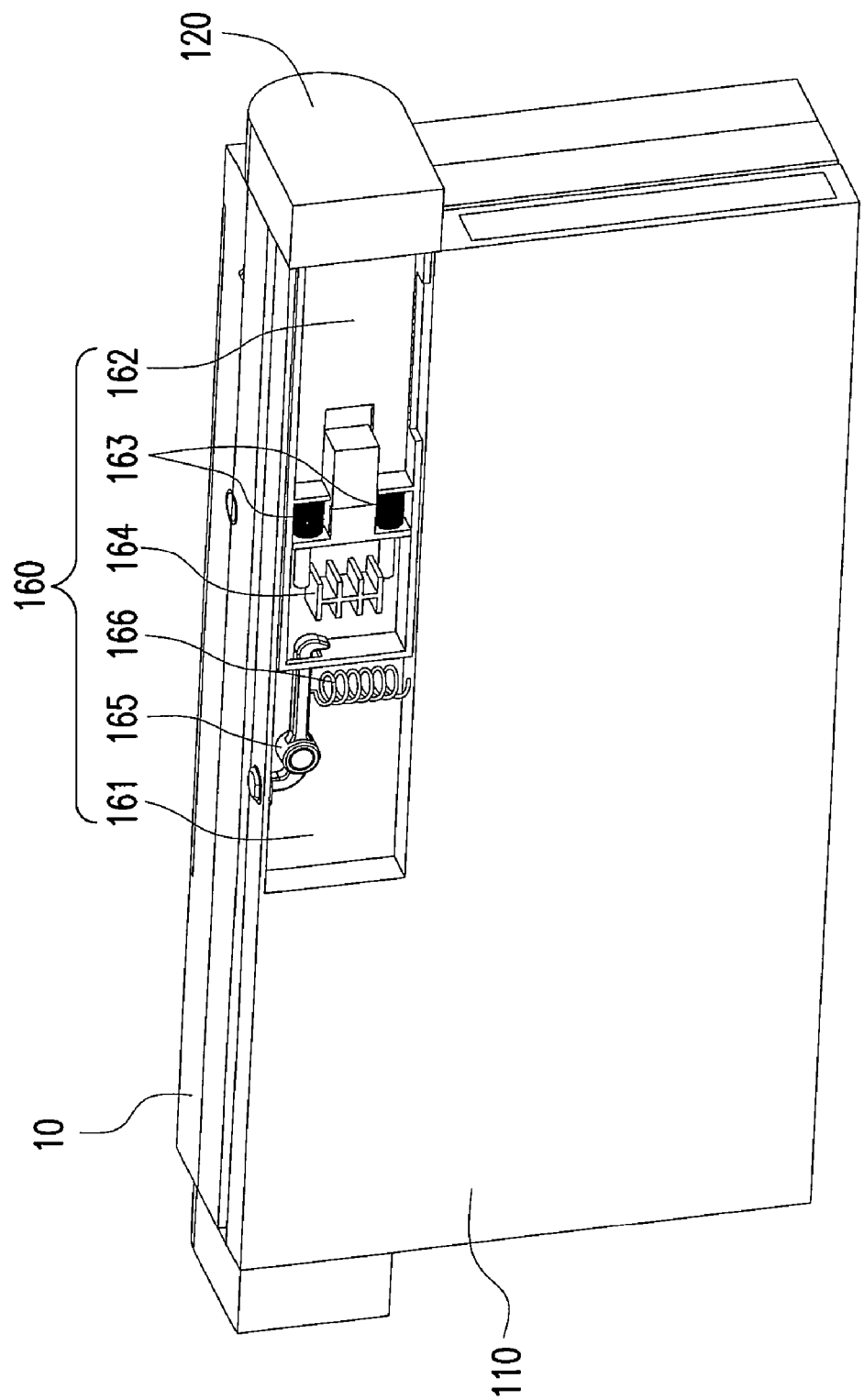

FIGS. 6A and 6B are partial perspective views respectively illustrating an adjusting mechanism when at an extended position and at a retracted position after the expansion unit for an electronic device and the electronic device in FIG. 3 are assembled. Referring to FIGS. 6A and 6B, in this embodiment, the expansion unit 100 for an electronic device further includes an adjusting mechanism 160 disposed between the pivoting mechanism 120 and the base 110, for adjusting a distance between the pivoting mechanism 120 and the base 110.

The adjusting mechanism 160 includes a slide rail 161, a slide member 162, and a reset member 163. The slide rail 161 is disposed on the base 110. The slide member 162 slides along the slide rail 161 between an extended position and a retracted position. The pivoting mechanism 120 is fixed to the slide member 162. The reset member 163 is disposed between the slide rail 161 and the slide member 162, for forcing the slide member 162 to slide towards the extended position (FIG. 6A). The reset member 163 may be an elastomer, such as a spring.

The adjusting mechanism 160 further includes a stop member 164 disposed on the slide rail 161, for defining a sliding range of the slide member 162 relative to the slide rail 161.

In order to connect the expansion unit connector 130 to the device connector 12 (as shown in FIG. 1A), a force is exerted on the pivoting mechanism 120 to make the slide member 162 slide along the slide rail 161. Meanwhile, a potential energy is accumulated on the reset member 163 until the slide member 162 slides relative to the slide rail 161 from the extended position (FIG. 6A) to the retracted position (FIG. 6B).

In order to temporarily fix the slide member 162 at the retracted position (FIG. 6B) relative to the slide rail 161, the adjusting mechanism 160 further includes a trigger 165 and another reset member 166. The trigger 165 is pivotally connected to the slide rail 161, for buckling the slide member 162. Moreover, the reset member 166 is disposed between the trigger 165 and the slide rail 161, for maintaining the trigger 165 at the position for buckling the slide member 162.

In view of the above, the position of the electronic device relative to the base of the expansion unit for an electronic device is adjusted by the pivotal mechanism of the expansion unit for an electronic device. Moreover, the expansion unit connector and the transmission line of the expansion unit for an electronic device are hidden in the pivoting mechanism. Therefore, when the expansion unit for an electronic device and the electronic device are assembled, the expansion unit connector and the transmission line are not exposed, thus maintaining a fine appearance.

Though the present invention has been disclosed above by the embodiments, they are not intended to limit the present invention. Anybody skilled in the art can make some modifications and variations without departing from the spirit and scope of the present invention. Therefore, the protecting range of the present invention falls in the appended claims and their equivalents.

What is claimed is:

1. An expansion unit for an electronic device adapted to be detachably assembled to the electronic device, wherein the electronic device comprises a device connector on one side thereof, the expansion unit for the electronic device comprising:
    a base;
    a pivoting mechanism located on one side of the base and comprising a shaft and a bearing fitting therewith, wherein the shaft is rotated about a rotation axis relative to a bearing on the electronic device; and
    an expansion unit connector disposed in the shaft and rotated along with the shaft relative to the bearing fitting, and being detachably and electrically connected to the device connector along a movement axis that is substantially parallel to the rotation axis and further comprising another shaft disposed on another side of the base for fitting the bearing disposed on another side of the electronic device;
    wherein when the expansion unit connector is connected to the device connector, the position of the electronic device relative to the base is adjusted by the pivoting mechanism.

2. The expansion unit for an electronic device according to claim 1, further comprising:
    a transmission line connected to the expansion unit connector and extending into the base, wherein a section of the transmission line winds around the shaft.

3. The expansion unit for an electronic device according to claim 2, wherein the pivoting mechanism further comprises a housing for accommodating the shaft and the transmission line.

4. The expansion unit for an electronic device according to claim 2, further comprising:
    a keyboard module disposed on the base and electrically connected to the device connector of the electronic device through the transmission line and the expansion unit connector.

5. The expansion unit for an electronic device according to claim 2, further comprising:
    a battery module disposed in the base and electrically connected to the device connector of the electronic device through the transmission line and the expansion unit connector.

6. The expansion unit for an electronic device according to claim 1, wherein the shaft provides a torsion relative to the electronic device and the expansion unit.

7. The expansion unit for an electronic device according to claim 1, wherein the other shaft provides a torsion relative to the electronic device and the expansion unit.

8. The expansion unit for an electronic device according to claim 1, further comprising:
    an adjusting mechanism disposed between the pivoting mechanism and the base for adjusting a distance between the pivoting mechanism and the base.

9. The expansion unit for an electronic device according to claim 8, the adjusting mechanism comprises:
    a slide rail disposed on the base;
    a slide member slid along the slide rail between an extended position and a retracted position; and
    a reset member disposed between the slide rail and the slide member for forcing the slide member to slide towards the extended position.

10. The expansion unit for an electronic device according to claim 9, wherein the adjusting mechanism further comprises:
    a stop member disposed on the slide rail for defining a sliding range of the slide member relative to the slide rail.

11. The expansion unit for an electronic device according to claim 9, wherein the adjusting mechanism further comprises:
    a trigger pivotally disposed on the slide rail for buckling the slide member at the retracted position; and
    another reset member disposed between the trigger and the slide rail.

12. The expansion unit for an electronic device according to claim 1, wherein the movement axis coincides with the rotated axis.

* * * * *